(12) United States Patent
Nahar et al.

(10) Patent No.: US 8,126,681 B2
(45) Date of Patent: Feb. 28, 2012

(54) SEMICONDUCTOR OUTLIER IDENTIFICATION USING SERIALLY-COMBINED DATA TRANSFORM PROCESSING METHODOLOGIES

(75) Inventors: Amit V Nahar, Dallas, TX (US); John M Carulli, Richardson, TX (US); Kenneth M Butler, Richardson, TX (US); Thomas J Anderson, Dallas, TX (US); Suresh Subramaniam, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 369 days.

(21) Appl. No.: 12/566,387

(22) Filed: Sep. 24, 2009

(65) Prior Publication Data

US 2011/0071782 A1    Mar. 24, 2011

(51) Int. Cl.
G06F 19/00  (2006.01)
(52) U.S. Cl. ..................................... 702/190
(58) Field of Classification Search .......... 702/182–185, 702/190
See application file for complete search history.

(56) References Cited

U.S. PATENT DOCUMENTS

| 6,184,048 | B1 | 2/2001 | Ramon |
| 6,298,370 | B1* | 10/2001 | Tang et al. ................ 718/102 |
| 7,129,735 | B2 | 10/2006 | Subramaniam et al. |
| 7,494,829 | B2 | 2/2009 | Subramaniam et al. |

* cited by examiner

*Primary Examiner* — Edward Raymond
(74) *Attorney, Agent, or Firm* — Jacqueline J. Garner; Wade J. Brady, III; Frederick J. Telecky, Jr.

(57) ABSTRACT

A method for identifying outlier semiconductor devices from a plurality of semiconductor devices includes performing at least one electrical test to obtain electrical test data including at least one test parameter, applying at least a first data transform processing methodology to the electrical test data to generate processed test data, and applying a second data transform processing methodology that is different from the first data transform processing methodology to process the processed test data. The second data transform processing methodology applies an outlier test limit to identify non-outlier devices that comprise semiconductor devices from the semiconductor devices that conform to the outlier test limit and outlier devices that do not conform to the outlier test limit. The semiconductor devices are dispositioned using the outlier identification results. At least one of the data transform processing methodologies can include statistics.

19 Claims, 4 Drawing Sheets

CONTINGENCY TABLE:

|  | OUTLIERS | NON-OUTLIERS |
|---|---|---|
| BURN-IN FAILS | 4 | 49 |
| BURN-IN PASSES | 173 | 8716 |

CHI-SQUARE TEST ⟹

| CHI-SQUARE | 8.5185 |
|---|---|
| P-VALUE | 0.0035 |

SEMICONDUCTOR OUTLIER IDENTIFICATION USING SERIALLY-COMBINED DATA TRANSFORM PROCESSING METHODOLOGIES

FIELD

Disclosed embodiments related to identification of outlier semiconductor devices using data-driven methods.

BACKGROUND

Semiconductor devices may be fabricated on the surface of a semiconductor wafer in layers and later singulated after wafer probe into individual chips. The individual chips thus fabricated are subjected to a series of tests to determine if the chips function properly both before (at wafer probe) and after being singulated (e.g., package test). These tests are sometimes repeated at several points in the manufacturing process, since the steps involved in singulating and packaging the chips can result in thermal and mechanical stresses which can induce failures of individual chips. The tests are designed to identify parts that are actually failing when tested, a failure sometimes referred to as a "time-zero" failure.

But many failures that occur in semiconductor chips are not "time-zero" failures, but instead failures that occur later after the chips have been in operation for a short time. These failures, sometimes referred to as "infant-mortality" or "early" failures, are sometimes identified through the use of a "burn-in" process, in which the chips are operated for an extended period (compared to the duration of normal production testing) beyond the electrical and environmental ranges defined by the design engineers for normal operation. This operational test period may identify a significant number of failures, but this is accomplished at the expense of the additional cost of testing, as well as a slightly reduced intrinsic life expectancy of the chips tested that go on to use in the field.

Some manufacturers have used a "no burn-in" approach, using time-zero failures to predict early failures without a production burn-in. Using time-zero failures to predict marginal chips, however, does not always predict failures of chips that are defective. These unpredicted "statistical outliers" tend to increase in number as the dimensions of the semiconductor structures within the chips decrease driving increased variance, and are thus not reliably predicted by time-zero-based non burn-in techniques when applied to many of today's sub-micron semiconductor devices.

Analysis of devices that have actually failed can provide an improved statistical basis for identifying statistical outliers. However, known outlier screening techniques are either not sufficient or not applicable to the given domain to attain some required product quality levels. Improved outlier identification algorithms are needed to minimize scrap or downgrade material, and monitor disposition in operations such as wafer probe and package test. As process variance continues to increase at every new technology node, new outlier screening techniques that more highly correlate outlier material to defective material are needed for burn-in reduction or elimination and to improve quality by scrapping outlier devices which can reduce the test cost and provide lower defect rates (e.g., defective parts per million (DPPM)).

SUMMARY

Disclosed embodiments serially combine multiple data transform processing methodologies into a single flow so that the processed device data provided by one methodology (e.g., the first data transform processing method that can generate a first data set) is passed on as data that is processed by a second data transform processing methodology. The second data transform processing methodology provides an outlier result that can be used to define which devices are outliers. Exemplary transforms can be statistical, mathematical, linear shift, or spatial in nature, or combinations of these transformations.

In a typical embodiment, the devices analyzed for outlier status are from a population of good devices based on a set of test parameters applied at a probe or a test insertion. Due to the use of a combination of complementary methodologies disclosed herein, the outlier population hidden in the good device population is thus smaller and more highly correlated to the electrical failure (i.e. electrically defective) population observed at a subsequent test or customer use (e.g., an end application such as a field use) point, as compared to known outlier screening methodologies. The outlier results obtained using disclosed embodiments can thus be used to reduce costs and improve reliability by segregating (e.g., scrapping or downgrading) outlier devices within the good device population before they show up as electrical failures at package test, subsequent test points or in an end application.

In one embodiment, a method for identifying outlier semiconductor devices from a plurality of semiconductor devices is disclosed. The method includes performing at least one electrical test to obtain electrical test data comprising at least one test parameter. At least a first data transformation method is applied to the electrical test data to generate processed test data. A second data transform processing method is then applied that is different from the first data transform processing method to the processed test data. The second data transform processing method applies an outlier test limit to identify non-outlier devices that comprise semiconductor devices from the plurality of semiconductor devices that conform to the outlier test limit and outlier devices that do not conform to the outlier test limit.

The data transform processing methods need not be statistical. However, when at least one of the data transform processing methods comprise a statistical method, the variance reduction is generally enhanced sufficiently to clearly separate and segregate the outlier populations. The data processing in one embodiment includes Location Averaging (LA; a spatial transformation) combined with regression (i.e. statistical). In some embodiments, results can be also combined through voting and weighting. Voting and weighting may or may not be statistical in nature. For example, voting and weighting can be driven by statistical data mining or be set by design simulation derived information.

DETAILED DESCRIPTION

Disclosed embodiments are described with reference to the attached figures, wherein like reference numerals are used throughout the figures to designate similar or equivalent elements. The figures are not drawn to scale and they are provided merely to illustrate the disclosed embodiments. Several disclosed aspects are described below with reference to example applications for illustration. It should be understood that numerous specific details, relationships, and methods are set forth to provide a full understanding of the disclosed embodiments. One having ordinary skill in the relevant art, however, will readily recognize that embodiments of the invention can be practiced without one or more of the specific details or with other methods. In other instances, well-known structures or operations are not shown in detail to avoid obscuring the disclosure. The disclosed embodiments are not limited by the illustrated ordering of acts or events, as some acts may occur in different orders and/or concurrently with other acts or events. Furthermore, not all illustrated acts or events are required to implement a methodology in accordance with embodiments of the invention.

Disclosed embodiments include methods for identifying outlier semiconductor devices from a plurality of semiconductor devices that is referred to herein as multiple serially combined data transform methodologies for outlier screening (MSCDT-OS). Some of the data transformations may have partial or complete foundations of a statistical nature, while others have roots from more physical or informational fundamentals. The processed device data derived from one methodology is provided as an input to the second methodology. Although generally described as being based on two serially connected methodologies, wherein the processed device data output of the first methodology is an input to the second methodology, embodiments of the invention can include more than two serially connected methodologies and can also include some parallel connectivity, such as two or more first or second stage methodologies.

MSCDT-OS generally identifies fewer devices as outlier devices that are "hidden" among a good device population (e.g., within a set of parametric limits, such as based on customer supplied specifications) for a given number devices that are later revealed as failed devices, as compared to conventional single methodology statistical outlier screening (SOS) methods. The outlier population hidden in the good device population is thus smaller and more highly correlated to the electrical failure (i.e. electrically defective) population observed at a subsequent test point, as compared to conventional single methodology outlier screening methods. As a result, embodiments of the invention can be used to reduce costs by segregating (e.g., scrapping or downgrading) outlier devices within the good device population before they show up as electrical failures at package test, subsequent test points or in an end application, and improving reliability by segregating outlier devices that might pass a subsequent electrical test (e.g., package test), but would become field failures.

In MSCDT-OS, in general, electrical test data is obtained for at least one parameter, and generally a plurality of parameters, taken on a population of semiconductor devices (wafer or package form), and is first mined using a first data transform processing methodology. In one embodiment, the first data processing methodology extracts a list of devices that conform and a list of devices that do not conform (initial outliers) to an expected behavior reflected in initial outlier test limits. In another embodiment, the test data is statistically mined to represent processed test data, such as residuals (without initial outlier test limits and thus without an initial outlier determination). Residuals can be defined as the difference between the actual (measured) parameter value and the expected parameter value (e.g., model estimate). The processed test data output from the first data transform processing methodology is then used by a second different data transform processing methodology to provide a final outlier result than can be used to disposition the respective devices. The devices that do not conform to the outlier test limits applied by the second data transform processing method can be identified as outliers for that measurement.

In the case of wafer level test, for data transform processing methodologies that provide an outlier result, the outlier test limits can be set by other die on the same wafer or other wafers in the same lot, and can thus be a flexible (i.e. adaptive) test limit screen due to the expected behavior based on a measured population of actual devices. In another embodiment, the outlier test limits can be fixed. For example, a minimum frequency limit can be set based on a circuit designer's input or simple one time characterization analysis done on initial lots. Such fixed outlier limits can be hard coded in the test program and not revisited often or at all. Fixed outlier limits could also be derived from statistical methods. For a screen involving multiple test parameters, outlier test limits for some test parameters can comprise flexible outlier test limits, and fixed outlier test limits for some other test parameters.

Figure 1:
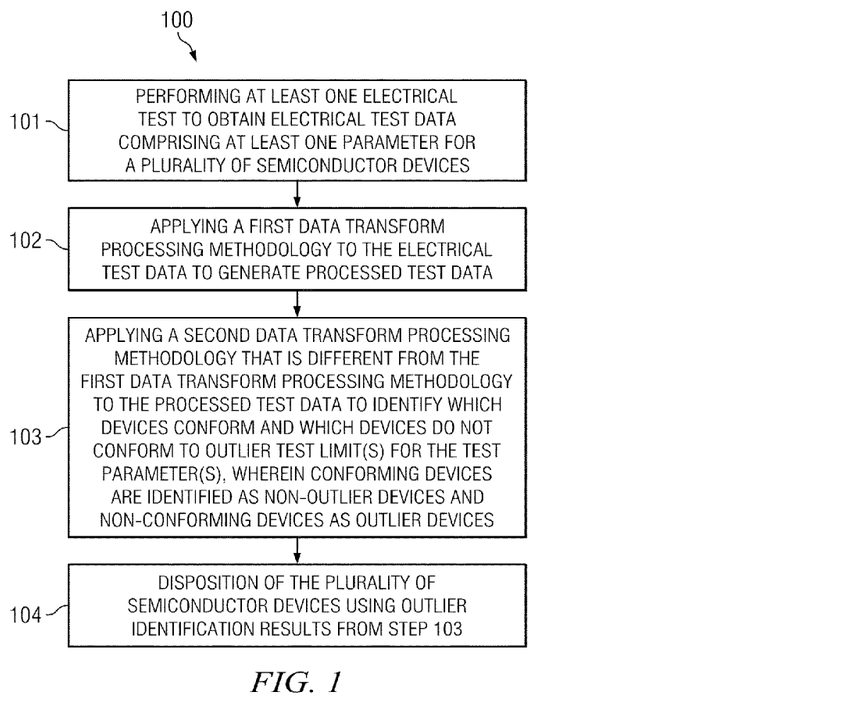
FIG. 1 is a flow chart showing steps for an exemplary method of statistical outlier identification for semiconductor devices, according to an embodiment of the invention.

FIG. 1 is a flow chart showing steps for an exemplary method 100 of outlier identification for semiconductor devices, according to an embodiment of the invention. Step 101 comprises performing at least one electrical test to obtain electrical test data comprising at least one parameter (frequency, current, voltage, etc.) for the plurality of semiconductor devices. The electrical test data can be from wafer level from scribe line test modules or drop-ins, and from package level devices. The test data can be accompanied by device identification data (e.g., lot number, wafer number, and/or die identification (e.g., x,y location on the wafer)).

In step 102, a first data transform processing methodology is applied to the electrical test data to generate processed test data. The first data processing methodology can comprise spatial filtering which as known in the art can account for the relative positions of the die/chips to one another (e.g., nearest neighbors on a wafer are given higher weight). One embodiment of spatial filtering comprises LA.

Spatial filtering can comprise LA, which is explained below for a wafer-level application. NNR is first explained, which is the foundation for LA. As the name implies, as described above NNR is a neighborhood-based technique. For each parameter under study, the healthy die estimate is constructed from the median of the same measurement for the eight surrounding die. The median is generally used instead of the mean because it is less sensitive to outlier responses. If one or more of the measurements is missing in the neighborhood, it is allowed to expand slightly so that sufficient measurements can be used to construct the estimate. When the estimate is constructed, a residual is formed by subtracting it from the measurement from the die of interest. The residual transformation reduces data variance and also can rotate the distribution as it centers it on zero. This permits the use of tighter limits, thus minimizing overkill LA differs from NNR in that the definition of the "neighborhood" is intentionally varied.

LA can output an initial outlier result based on flexible or fixed test limits. In another embodiment, an initial outlier result is not provided. Instead, in this alternate embodiment, raw processed (e.g., transformed) test data can be output, such as residuals to characterize the respective devices. As described above, residuals can be defined as the difference between the actual (measured) parameter value, such as quiescent state supply current (IDDQ) or the minimum supply voltage value at which an IC can function correctly (min-VDD) and the expected parameter value (e.g., model estimate). The spatial filter can be a spatial compression filter that can suppress (i.e. remove) systemic parametric noise, such as due to an essentially fixed parametric variation for certain parameters, such as from the center to edge of the wafer. Spatial filtering techniques other than LA can be used with embodiments of the invention, such as basic spatial techniques including surround by, row, column, and diagonal screens. In addition, other more sophisticated spatial filtering techniques such as Nearest Neighborhood Residual (NNR), and Unit Level Predicted Yield (ULPY) models may be used.

Step 103 comprises applying a second data transform processing methodology that is different from the first data transform processing methodology to the processed test data generated in step 102. The second data transform processing method can comprise a univariate screen or a multivariate screen (e.g., a principal component analysis such as (PCA). The second data transform processing method is operable to identify devices from the plurality of semiconductor devices that conform to the outlier test limit(s) for the test parameter(s) for the given test(s), wherein such devices can be identified as statistical non-outlier devices. For some test parameters, there are also fixed production test limits for direct disposition, such as based on a customer specification. In such instances, good electrical devices (GED) can be identified and the die or packaged ICs outside the fixed test limits can be scrapped. From the distribution of GEDs, using outlier test limit(s) that are narrower than the production test limits for at least one parameter, outlier devices and non-outlier devices can be identified.

For step 103, as described above, the outlier test limits can be set by data from other die on the same wafer or lot, and can thus be flexible (i.e. adaptive), or can be based on fixed test limits. Step 104 comprises a disposition step. In the disposition step statistical outlier devices identified in step 103 can be scrapped, be subjected to additional testing (e.g., burn in), or simply monitored and not acted on (at least upon identification).

Figure 2A:
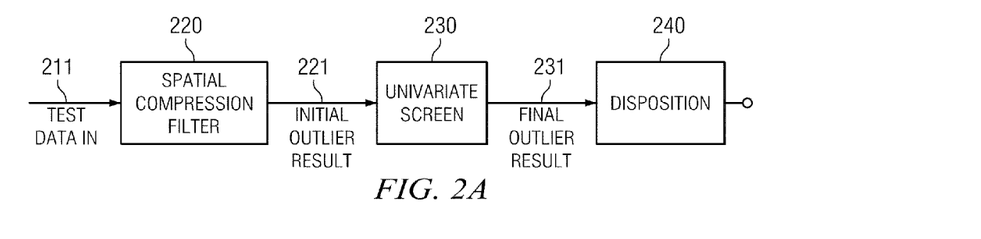
FIG. 2A shows a block diagram depiction of a semiconductor device outlier identification flow comprising multiple serially-combined data transform processing methodologies, according to an embodiment of the invention.

FIG. 2A shows a block diagram depiction of a semiconductor device outlier identification flow comprising multiple serially-combined data transform processing methodologies, according to an embodiment of the invention. Electrical test data 211 is shown input into a spatial compression filter (SCF) block, such as a LA block. SCF block 220 outputs an initial outlier result 221, which includes an identification of outlier devices and non-outlier devices. Initial outlier result data 221 is shown input into univariate screen block 230. Univariate screen block 230 can comprise a technique for limit generation including Tukey (e.g., interquartile range (IQR) Part Average Testing (PAT) or sigma algorithms) and outputs a final outlier result 231 which is used by disposition block 240 to disposition the outliers identified by univariate screen block 230. As described above, outliers identified by univariate screen block 230 can be dispositioned by disposition block 240 by scrapping, subjecting to additional testing (e.g., burn in), tracking via some marking, or monitoring, typically based on the parameter(s) resulting in the outlier classification.

Figure 2B:
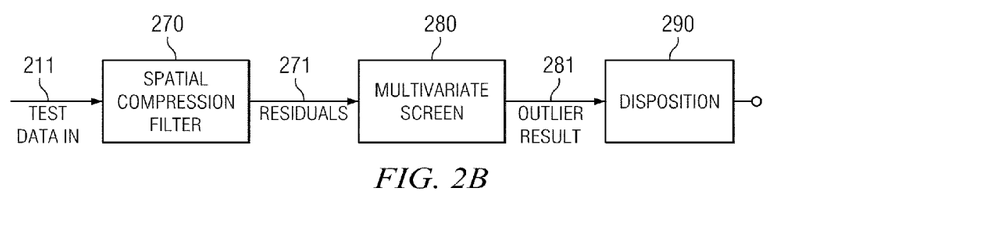
FIG. 2B shows a block diagram depiction of a semiconductor device outlier identification flow comprising multiple serially-combined data transform processing methodologies with the second methodology governed by multivariate statistics, according to another embodiment of the invention.

FIG. 2B shows a block diagram depiction of a semiconductor device outlier identification flow comprising multiple serially-combined data transform processing methodologies, according to another embodiment of the invention. Electrical test data 211 is shown input into a spatial compression filter (SCF) block 270, such as a LA block. SCF block 270 outputs residual data 271, which thus does not include an initial outlier result. Residual data 271 is shown input into multivariate screen block 280. Multivariate screen block 280 can comprise a PCA block that outputs an outlier result 281 which is used by disposition block 290 to disposition the outliers identified by multivariate screen block 280. As described above, outliers identified by multivariate screen block 280 can be dispositioned by disposition block 290 by scrapping, subjecting to additional testing (e.g., burn in), tracking via some marking, or ignoring, typically based on the parameter(s) resulting in the outlier classification.

Figure 3A:
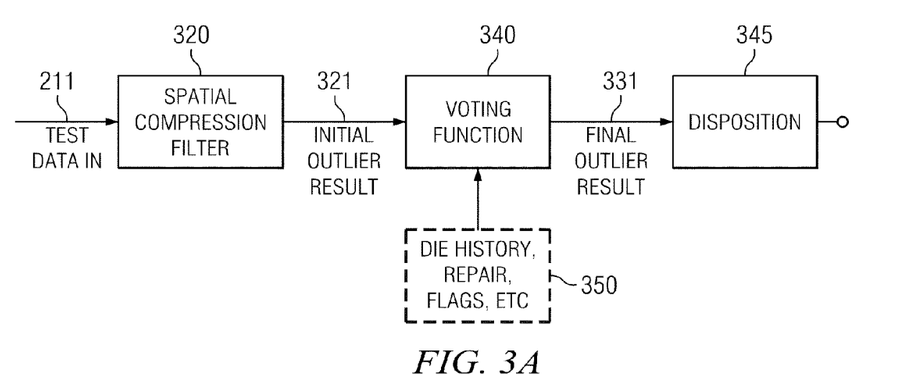
FIG. 3A shows a block diagram depiction of a semiconductor device outlier identification flow comprising multiple serially-combined data transform processing methodologies with the second methodology governed by a voting function that is dependent on the die history, such as repair status, according to another embodiment of the invention.

Disclosed embodiments also include the capability to combine multiple data transform processing techniques in parallel such that they can have different weights and thus "vote" on the outcome regarding outlier status for devices. FIG. 3A shows a block diagram depiction of a semiconductor device outlier identification flow comprising multiple serially-combined transform processing methodologies, according to another embodiment of the invention. Electrical test data 211 is shown input into a spatial compression filter (SCF) block 320, such as an LA block. SCF block 320 outputs initial outlier result data 321, which includes an identification of outlier devices and non-outlier devices. Initial outlier result data 321 is shown input into voting function block 340. Die history data 350 is also input to voting function block 340. Die history 350 can comprise die history items including repair status, rework status, flags, etc. As known in the art, "repaired" die receive additional processing such as laser trimming or fuse blowing to allow a device to meet a set of parametric limits. Flags refer to events such as trimming for certain EPROMs to adjust component values.

In one embodiment, the voting function 340 may be based strictly on relative statistical significance of treatments. In another embodiment, the voting function may be based on some combination of statistical significance and relative effective capture of outliers, such as by count. In yet another embodiment, the voting function 340 can be based on weighted combinations of effectiveness, such as either as the reciprocal of the square of the summed residuals or efficiency of capturing outliers (a fraction of the population identified as outliers by any combination of parameters, for example). In even another embodiment, any combination of the above voting function embodiments or other appropriate techniques as deemed efficient and effective that can account for the largest population of, for example, burn in failures, without overkill may be used.

Thus, voting function 340 can apply equal, or more typically unequal, weighting to its respective inputs. For example, repaired die from a population of good die (from a test insertion) may be found to have a fairly strong correlation to later device failures as compared to other parameters or history items. In that case, the repair status may be given higher weight in the voting. Voting function outputs a final outlier result 331 which is used by disposition block 345 to disposition the outliers identified by voting function block 340.

Figure 3B:
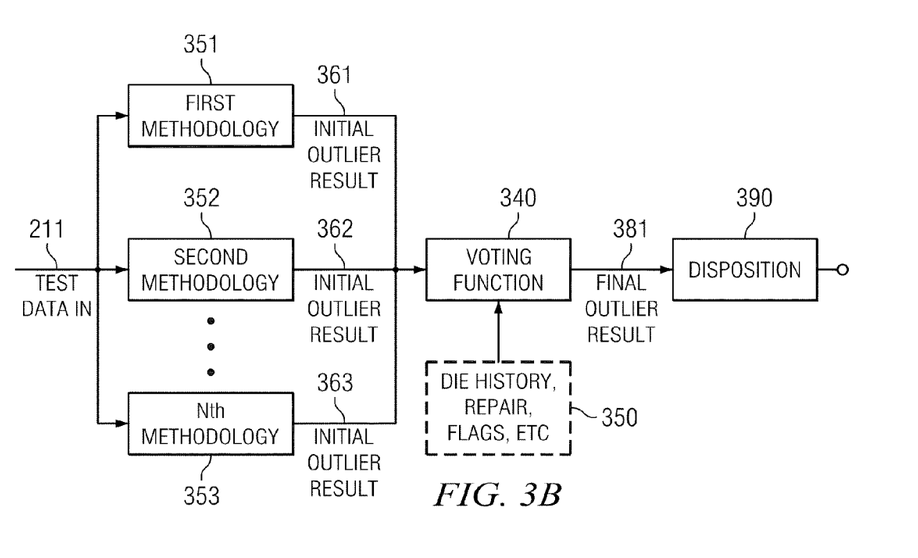
FIG. 3B shows a block diagram depiction of a semiconductor device outlier identification flow comprising multiple serially-combined data transform processing methodologies, with multiple methodologies to generate outlier results before the voting function, according to yet another embodiment of the invention.

FIG. 3B shows a block diagram depiction of a semiconductor device outlier identification flow comprising multiple serially-combined transform processing methodologies, according to yet another embodiment of the invention. Electrical test data 211 is shown input into a first data transform processing methodology block 351, a second data transform processing block 352, and an Nth data transform processing block 353, where N=the number of different data transform processing methodologies, that outputs initial outlier result 361, initial outlier result 362, and initial outlier result 363, respectively. Initial outlier results 361, 362, and 363, and die history 350 are all shown input into voting function block 340. As described above, voting function block 340 can apply equal or unequal weighting to its respective inputs. Voting function outputs a final outlier result 381 which is used by disposition block 390 to disposition the outlier devices identified by voting function block 340.

Numerous variations to those described above will be apparent to those having ordinary skill in the art. For example, LA can comprise the second data transform processing method, such as when PCA is used as the first data transform processing method to identify principle components, which are then processed by LA.

Disclosed embodiments also include methodologies to account for systematic holes in the data stream, such as in the case where sampling is used for test time reduction purposes. Some processing techniques can tolerate some level of missing data and still produce a good result evidenced by the outlier status identified being highly predictive of later defective status. However, some processing techniques may not be used if a certain level of data is missing. Therefore, the algorithm mix or voting function can be modified on the fly, such as LA morphing the electrical neighborhood to account for holes by allowing the definition of the neighborhood to vary by replacing die in the electrical neighborhood with missing measurements with another lower-ranked die someplace else in the matrix. For some mission critical applications, while some missing data can be accommodated in the algorithms, the material with the missing data may be segregated on that account alone. In that case, only material with sufficient data to run the transformations and with data for the exact material in question would and also having a passing state would be classified as non-outlier.

EXAMPLES

Embodiments of the invention are further illustrated by the following specific Examples, which should not be construed as limiting the scope or content of embodiments of the invention in any way.

Figure 4:
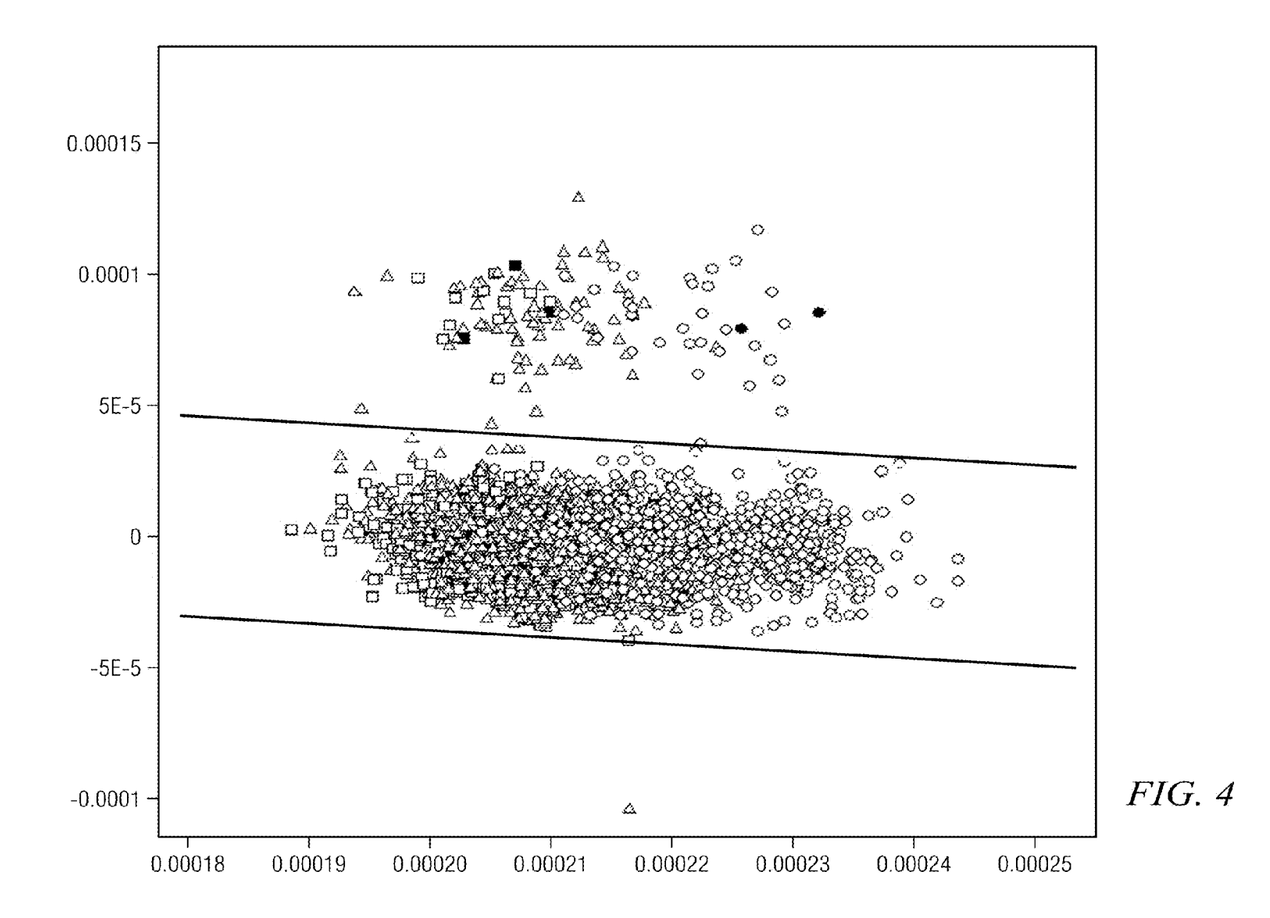
FIG. 4 shows a plot of residuals vs. the model estimate for the residual showing a population of intrinsic (healthy) die within model generated prediction limits and a population of outlier die both above and below the prediction limits, according to an embodiment of the invention.

Exemplary outlier test limiting setting is first described for LA in the case of a die population. An important aspect of both NNR and LA is limit setting, i.e., deciding where to draw the line between the intrinsic (healthy) distribution and the outliers. Limit setting is approached in this example by defining the intrinsic (healthy) die population first. Once the intrinsic population is defined, all die outside that population are outliers. This concept of limit setting is exactly opposite to some of the earlier work published under SPP™, which used the bad die distribution to define limits around the regression line to identify outliers. Prediction limits are calculated based on the confidence level provided by the user. The confidence levels can generally vary anywhere between 95% and 99.99%. The prediction limits will become wider as the confidence level is increased. This concept is similar to the fact that 6-Sigma limits are wider than 3-Sigma limits. These prediction limits are calculated for every parameter and wafer. The limits will automatically adjust as the distribution of the estimate and residual data changes for every wafer. FIG. 4 shows a plot of residuals vs. the model estimate for the residual showing a population of intrinsic (healthy) die within prediction limits and a population of outlier die both above and below the prediction limits according to an embodiment of the invention.

In the LA method, a neighborhood model can be used to obtain residuals, and outliers are identified in the residual space. The idea behind using the neighborhood model is to identify die which are different from their neighbors. If there a large cluster of defects on a wafer (e.g., a large region on a wafer with high IDDQ), then there is a possibility that a few die in that region will have large estimate values, but small residual values because the die of interest will be similar to its neighbors. Since the limits are defined only in the residual space, in such cases some defective die will not be identified as outliers. This is a limitation of the conventional LA method.

Limits can also be defined in the estimate space. For example, estimate model parameters can be generated using an iterative prediction-error minimization method, such as using a subspace method.

Figure 5A:
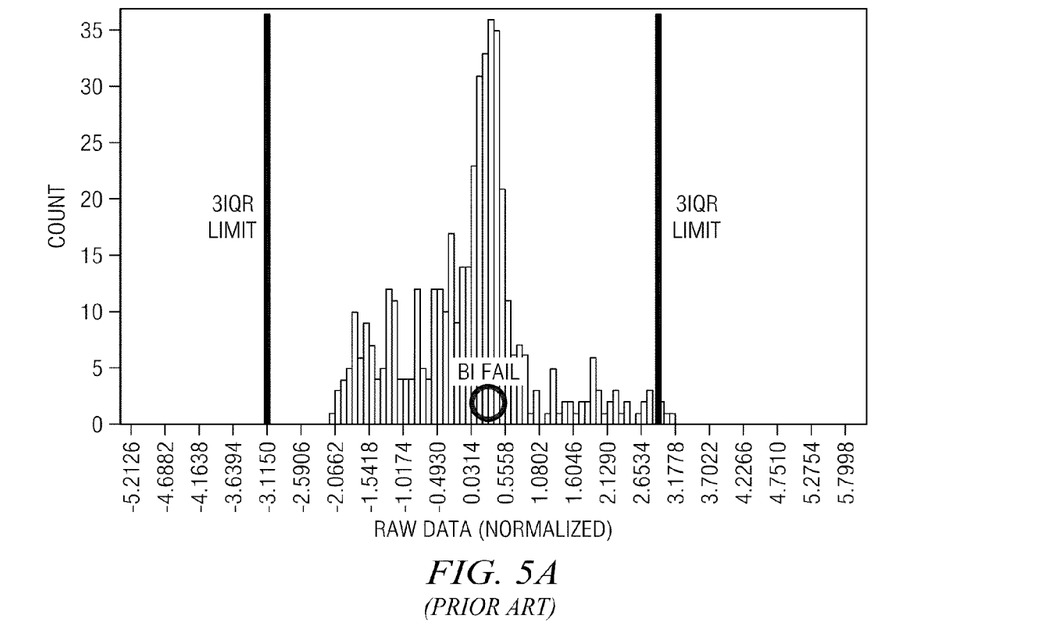
FIGS. 5A and B show the normalized raw data distribution for a parameter and one wafer (prior art) and the residual data distribution obtained from location averaging (LA) for the same parameter according to an embodiment of the invention.
Figure 5B:
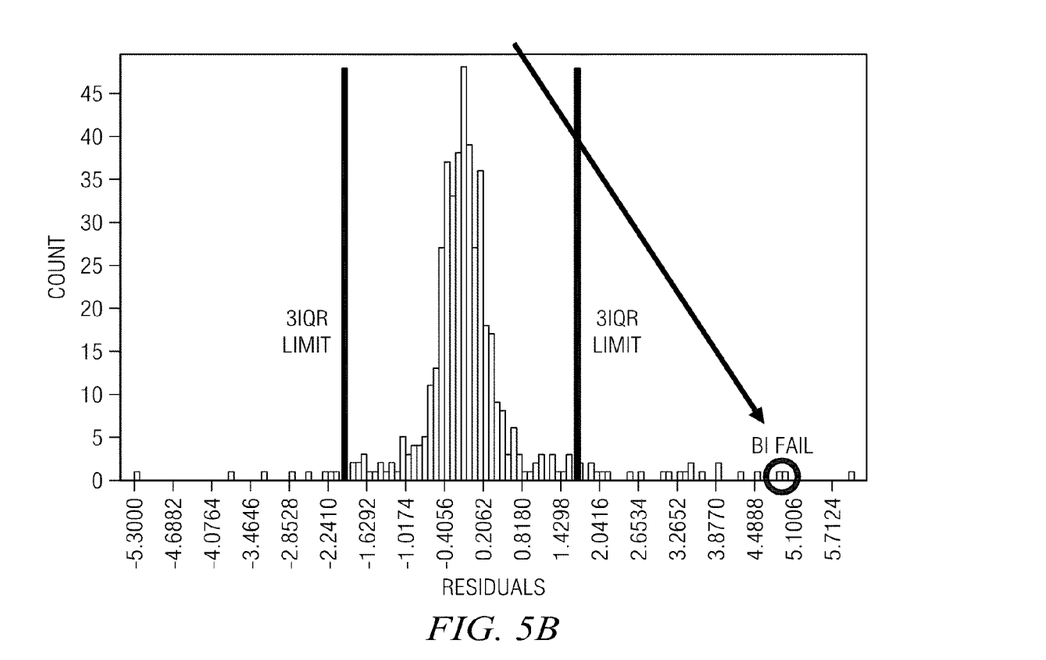

A question arises as to why the residual data transformation as described herein is required. It will be illustrated with an example of how the residual data is more effective in reducing the intrinsic data variance and also in amplifying the outlier signature. FIGS. 5A and B show the normalized raw data distribution for a parameter and one wafer (prior art) and the residual data distribution obtained from LA for the same parameter according to an embodiment of the invention. In each case, 3 times Interquartile Range (3 IQR) limits are defined for this distribution to identify outliers. FIG. 5A shows a burn-in fail in the middle of this raw data distribution and inside the burn-in 3IQR limits shown. The intrinsic distribution for the residual data shown in FIG. 5B is clearly much tighter as compared to the raw data distribution shown in FIG. 5A.

Table 2 provided below compares the variance and the standard deviation of the intrinsic distribution for the raw data and residual data. The variance and standard deviation of the residual data is smaller than the corresponding metrics for the raw data. The IQR limits for residual data are also tighter compared to the IQR limits for raw data. The burn-in fail becomes an outlier in the residual data and is outside the IQR limits. This shows that the outlier signature is amplified using residual data. However, as described above, non-linear data transformations can be used as compared to linear transformation, such as based on residuals.

TABLE 2

Comparison of variance and standard deviation for raw data and residuals

|  | Raw data | Residuals |
| --- | --- | --- |
| Standard deviation | 0.99 | 0.56 |
| Variance | 0.99 | 0.31 |

Exemplary selection of parameters for outlier screening are now described. In a production environment, hundreds of electrical tests (parameters) are performed (recorded) at wafer probe and later at package test. It is often not practical to perform outlier screening on all parameters collected in production. Outlier screening is typically implemented only on a subset of parameters so that the overkill can be minimized. The challenge is how to select the parameters that are most sensitive for outlier identification for production implementation.

The Inventors have developed an exemplary flow to identify outlier screening parameters by correlating outliers at wafer probe with fails (burn-in fails or any other fails of interest). This flow allows the identification of tests which can catch these fails and also are statistically significant. The idea is that outlier screening will be implemented in production on these identified parameters and potential future burn-in or other fails will be screened at wafer probe or package test. There are three steps in the flow.

STEP 1: Identifying Dataset for Analysis

Typically, a sample of wafers containing at least one fail of interest are selected for the analysis.

STEP 2: Outlier Identification

Outlier identification methods are known. Once the wafers are selected for analysis, outliers are identified for every parameter and wafer generally using any data transformation or statistical outlier method. In this Example, LA is used for outlier identification. At the end of this step, a list of outliers is obtained for every parameter and wafer.

STEP 3: Statistical Selection of Parameters

Figure 6:
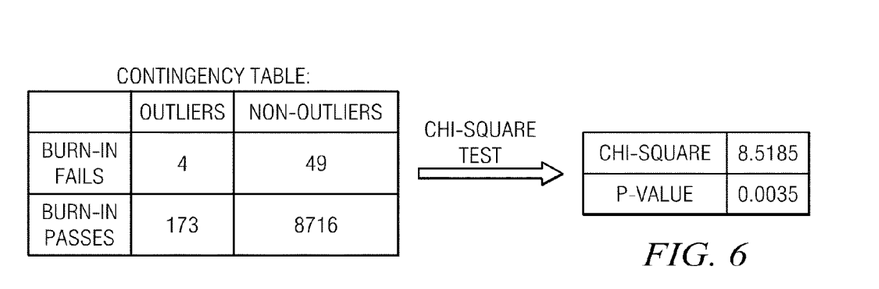
FIG. 6 is a 2×2 contingency table used to calculate the Chi-square and p-value statistics, according to an embodiment of the invention.

Once the list of outliers is obtained for every parameter and wafer, the next step is to correlate the fails to the outliers at wafer probe. If at least one fail is an outlier for a parameter, a contingency analysis can be created for the parameter such as the 2×2 contingency table shown in FIG. 6. Chi-square and the corresponding p-value metrics are computed for every test using the 2×2 contingency table. It is noted that Chi-square can be generalized to a contingency analysis, or replaced by a Logistic Regression.

All parameters with a certain p-value, such as $p<0.05$, can be considered to be statistically significant. An iterative approach is used for the selection of statistically significant parameters.

The iterative approach is inspired by static test compaction methods used in automatic test pattern generation (ATPG) and proceeds as follows:

1. Compute p-value and Chi-square for every parameter catching the fail
2. Remove all parameters from the dataset with p-value >0.05
3. From the remaining parameters, select the parameter with the lowest p-value
4. Remove all the outliers from the dataset for the selected parameter
5. Recalculate Chi-square and p-value for every parameter catching the fail in the reduced dataset
6. Repeat steps from 2 to 5 until no parameter has a p-value of <0.05 or until all the fails are caught
7. Step 2/3 can be modified to select and rank material based on highest number of fails caught. Alternatively it can be based on lowest acceleration factor, if failure analysis is available. Other ranking and compaction methods can be based on the available information and business requirements.

At the end of this iterative approach, a list of statistically significant parameters is identified which can catch maximum fails and also have least overkill. Typically the analysis is begun with anywhere between 50 and 1,500 parameters. After following the iterative approach as described above, a list of anywhere between 1 and 20 statistically significant parameters end up catching the fails. Typically all operational parameters (i.e. test time, etc) are removed before starting the analysis and only parameters related to chip functionality and performance (i.e. IDDQ, minVDD, Fmax, pin leakages, tests using on-chip parametric structures, etc.) are used for the selection of outlier screens. Even though all the identified parameters are statistically significant, a sanity check can be performed to confirm that the there is a relation between the identified parameter(s) and the failure modes observed on the fails of interest. In practice the sanity check has exposed a remarkably small number of retained but unrealistic parameters. When they are detected the unrealistic parameters can be removed from the production screen deployment.

Embodiments of the invention can be used for outlier detection for a wide variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method for identifying outlier semiconductor devices from a plurality of semiconductor devices, comprising:
   performing at least one electrical test to obtain electrical test data comprising at least one test parameter;
   applying at least a first data transform processing method to said electrical test data to generate processed test data, and
   applying a second data transform processing method that is different from said first data transform processing method to said processed test data, said second data transform processing method applying at least one outlier test limit to identify non-outlier devices that comprise semiconductor devices from said plurality of semiconductor devices that conform to said outlier test limit and outlier devices that do not conform to said outlier test limit.

2. The method of claim 1, wherein at least one of said first data transform processing method and said second data transform processing method comprise a statistical data processing method.

3. The method of claim 2, wherein:
   said first data transform processing method comprises said statistical data processing method and said processed test data is generated by said first data transform processing method includes an initial outlier result comprising interim non-outlier devices and interim outlier devices, and
   said second data transform processing method is applied to said interim outlier result.

4. The method of claim 3, wherein said statistical data processing method comprises spatial filtering and said second data transform processing method comprises a univariate screen.

5. The method of claim 4, wherein said univariate screen comprises a technique for limit generation.

6. The method of claim 5, wherein said technique for limit generation comprises inter-quartile, Part Average Testing (PAT), sigma or fixed limits.

7. The method of claim 2, wherein said processed test data generated by said statistical data processing method comprises residuals and said second data transform processing method comprises a univariate or multivariate screen.

8. The method of claim 7, wherein said multivariate screen comprises multivariate statistics.

9. The method of claim 1, wherein said at least a first data transform processing method comprises a plurality of different data transform processing methods and said second data transform processing method comprises a voting function.

10. The method of claim 9, wherein said voting function provides a plurality of different weights for differential weighting of respective data provided by said plurality of different data transform processing methods.

11. The method of claim 9, further comprising a die history for said plurality of semiconductor devices, wherein said die history comprises an input to said voting function.

12. The method of claim 1, further comprising a wafer, wherein said plurality of semiconductor devices are on said wafer.

13. The method of claim 1, wherein said plurality of semiconductor devices comprise a plurality of packaged semiconductor devices.

14. The method of claim 1, further comprising a production test limit for said test parameter, wherein said outlier test limit is within said production test limit.

15. The method of claim 1, wherein said outlier test limit comprises at least one fixed limit.

16. The method of claim 1, wherein said outlier test limit comprises at least one flexible limit, wherein said flexible limit is derived from said test parameter for said plurality of semiconductor devices.

17. A method for identifying outlier semiconductor devices from a plurality of semiconductor devices, comprising:
   performing at least one electrical test to obtain electrical test data comprising at least one test parameter;
   applying a first data transform processing method comprising spatial compression filtering to said electrical test data to generate processed test data, and
   applying a second data transform processing method that is different from said spatial compression filtering to said processed test data, said second data transform processing method applying at least one outlier test limit to identify non-outlier devices that comprise semiconductor devices from said plurality of semiconductor devices that conform to said outlier test limit and outlier devices that do not conform to said outlier test limit.

18. The method of claim 17, wherein said processed test data generated by said spatial compression filtering comprises residuals.

19. The method of claim 17, wherein:
   said processed test data generated includes an initial outlier result comprising interim non-outlier devices and interim outlier devices, and
   said second data transform processing method is applied to said interim outlier result.

* * * * *